(12) United States Patent
Wilkas (10) Patent No.: US 12,103,176 B2
(45) Date of Patent: Oct. 1, 2024

(54) LINEAR ROBOT WITH TWO-LINK ARM

(71) Applicant: Persimmon Technologies, Corp., Wakefield, MA (US)

(72) Inventor: Scott Wilkas, Lexington, MA (US)

(73) Assignee: Persimmon Technologies Corporation, Wafefield, MA (US)

( * ) Notice: Subject to any disclaimer, the term of this patent is extended or adjusted under 35 U.S.C. 154(b) by 40 days.

(21) Appl. No.: 16/788,941

(22) Filed: Feb. 12, 2020

(65) Prior Publication Data

US 2020/0262059 A1  Aug. 20, 2020

Related U.S. Application Data

(60) Provisional application No. 62/805,579, filed on Feb. 14, 2019.

(51) Int. Cl.
*B25J 9/12* (2006.01)
*B65G 47/90* (2006.01)

(52) U.S. Cl.
CPC ............ *B25J 9/123* (2013.01); *B65G 47/905* (2013.01)

(58) Field of Classification Search
CPC . B25J 9/0009; B25J 9/0027; B25J 9/02; B25J 9/042; B25J 9/104; B25J 9/126; B25J 18/04; B25J 11/0095; B25J 5/005; B25J 5/02; B60L 13/04; H01L 21/67173; H01L 21/67706; H01L 21/67724; H01L 21/67742; H01L 21/67766; H01L 21/68707; Y10S 414/135; Y10S 414/139; Y10S 414/141; Y10S 901/01; Y10S 901/15; Y10S 901/17; Y10S 901/21; Y10S 901/27; Y10T 74/20305; Y10T 74/20323

USPC ............ 74/490.1, 490.4; 414/226.05, 744.2, 414/744.5, 935; 901/15, 17, 21
See application file for complete search history.

(56) References Cited

U.S. PATENT DOCUMENTS

| | | | |
|---|---|---|---|
| 5,741,113 A * | 4/1998 | Bacchi | ...................... B25J 9/104 901/17 |
| 6,577,923 B1 | 6/2003 | White et al. | |
| 9,149,936 B2 | 10/2015 | Hosek et al. | |
| 10,224,232 B2 | 3/2019 | Hosek | |

(Continued)

FOREIGN PATENT DOCUMENTS

| | | |
|---|---|---|
| JP | 2008538654 A | 10/2008 |
| JP | 2009260087 A | 11/2009 |

(Continued)

*Primary Examiner* — Saul Rodriguez
*Assistant Examiner* — Brendan P Tighe
(74) *Attorney, Agent, or Firm* — Harrington & Smith (57) ABSTRACT

An apparatus including a linear transport configured to move in a transport chamber along a straight path; a robot connected to the linear transport, where the robot includes a robot drive and a robot arm connected to the robot drive, where the robot arm is a dual-link arm having a first link connected to the robot drive and a second link forming an end effector for supporting a substrate thereon; a controller connected to the linear transport and to the robot drive, where the controller is configured to provide movement of the linear transport along the straight path at a same time as extension and retraction of the dual-link arm to thereby move the end effector into or out of a substrate process chamber or a substrate holding area while both the linear transport and the dual-link arm are moving.

17 Claims, 10 Drawing Sheets

(56) References Cited

U.S. PATENT DOCUMENTS

| | | |
|---|---|---|
| 10,269,606 B2 | 4/2019 | Hosek |
| 2006/0182536 A1* | 8/2006 | Rice .................. H01L 21/67745 |
| | | 414/217 |
| 2006/0291988 A1 | 12/2006 | Machiyama et al. |
| 2007/0147976 A1* | 6/2007 | Rice .................. H01L 21/67225 |
| | | 414/217 |
| 2007/0147982 A1* | 6/2007 | Rice .................. H01L 21/67742 |
| | | 414/800 |
| 2008/0166210 A1* | 7/2008 | Hudgens ........... H01L 21/67196 |
| | | 414/288 |
| 2013/0071218 A1 | 3/2013 | Hosek et al. |
| 2013/0202390 A1 | 8/2013 | Yazawa et al. |
| 2014/0119856 A1 | 5/2014 | Duhamel et al. |
| 2015/0214086 A1 | 7/2015 | Hofmeister et al. |
| 2016/0229296 A1 | 8/2016 | Hosek et al. |
| 2017/0028546 A1 | 2/2017 | Wilkas et al. |
| 2017/0221748 A1 | 8/2017 | Kodama |
| 2018/0037409 A1 | 2/2018 | Manes et al. |
| 2018/0104831 A1 | 4/2018 | Hosek et al. |
| 2019/0115238 A1 | 4/2019 | Hofmeister et al. |

FOREIGN PATENT DOCUMENTS

| | | |
|---|---|---|
| JP | 2017139249 A | 8/2017 |
| WO | WO-2006115745 A1 | 11/2006 |
| WO | WO-2018170104 A1 | 9/2018 |

\* cited by examiner

LINEAR ROBOT WITH TWO-LINK ARM

CROSS REFERENCE TO RELATED APPLICATION

This application claims priority under 35 USC 119(e) to U.S. provisional application No. 62/805,579 filed Feb. 14, 2019 which is hereby incorporated by reference in its entirety.

BACKGROUND

Technical Field

The example and non-limiting embodiments relate generally to a robot and, more particularly, to a linear robot.

Brief Description of Prior Developments

Robots for transporting substrates are known. Linear drive systems for transporting a substrate transport robot is also known such as described in U.S. patent publication numbers US 2016/0229296 A1, US 2013/0071218 A1, US 2015/0214086 A1, and US 2017/0028546 A1 which are hereby incorporated by reference in their entireties.

SUMMARY

The following summary is merely intended to be exemplary. The summary is not intended to limit the scope of the claims.

In accordance with one aspect, an apparatus may be provided comprising: a linear transport configured to move in a transport chamber along a straight path; a robot connected to the linear transport, where the robot comprises a robot drive and a robot arm connected to the robot drive, where the robot arm comprises a dual-link arm having a first link connected to the robot drive and a second link forming an end effector for supporting a substrate thereon; a controller connected to the linear transport and to the robot drive, where the controller is configured to control movement of the linear transport along the straight path, where the controller is configured to control the robot drive to extend and retract the dual-link arm, where the controller is configured to provide the movement of the linear transport along the straight path at a same time as extension and retraction of the dual-link arm to thereby move the end effector into or out of a substrate process chamber or a substrate holding area while both the linear transport and the dual-link arm are moving.

In accordance with another aspect, a method may be provided comprising: providing a robot comprising a robot drive and a robot arm connected to the robot drive, where the robot arm comprises a dual-link arm having a first link connected to the robot drive and a second link forming an end effector for supporting a substrate thereon; mounting the robot onto a linear transport, where the linear transport is configured to move in a transport chamber along a straight path; connecting the robot drive and the linear transport to a controller, where the controller is configured to control movement of the linear transport along the straight path, and where the controller is configured to control the robot drive to extend and retract the dual-link arm, where the controller is configured to provide the movement of the linear transport along the straight path at a same time as the robot drive extension and retraction of the dual-link arm to thereby move the end effector into or out of a substrate process chamber or a substrate holding area while both the linear transport and the dual-link arm are moving.

In accordance with another aspect, a method may be provided comprising: moving a linear transport along a straight path inside a transport chamber; extending or retracting a robot arm at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon; controlling, by a controller connected to the linear transport and to the robot drive, the moving of the linear transport along the straight path and extension and retraction of the dual-link arm to thereby move the end effector into or out of a substrate process chamber or a substrate holding area while both the linear transport and the dual-link arm are moving.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
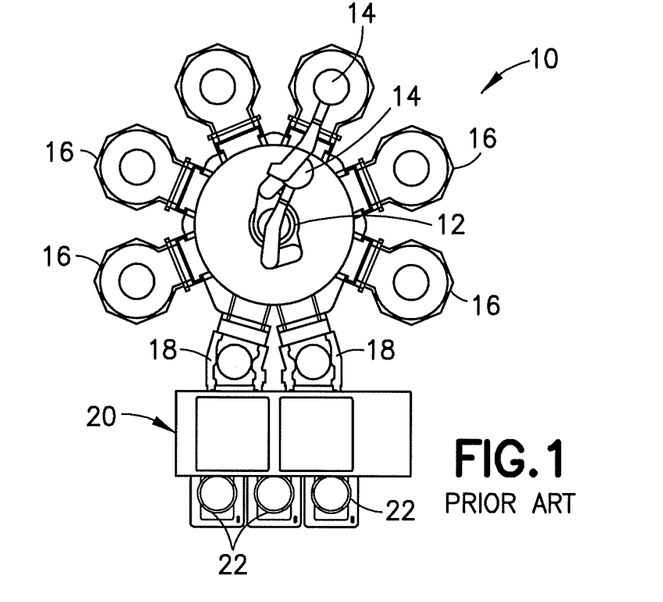
FIG. 1 is a top plan view of an example of a cluster tool.

Referring to FIG. 1, there is shown a schematic top view of a conventional cluster tool configuration of a substrate processing apparatus 10. The apparatus comprises a substrate transport apparatus 12 which comprises a robot adapted to transport substrates 14 between and among substrate processing chambers 16 and load locks 18 to an Equipment Front End Module (EFEM) 20, having substrate cassette elevators 22. The load locks form a type of substrate holding area with movable isolation doors or gates between the transport chamber 32 and the EFEM 20.

To reduce cost and increase efficiency, modern semiconductor factories are constantly striving to fit more process equipment in a smaller building. A typical factory layout has process tools arranged in linear rows called bays. The number of bays that can fit on the floor of the factory is limited by individual process tool length (depth). The number of tools that can fit in each row is limited by individual process tool width. Each individual process tool consists of process modules and automation hardware to transfer wafers from input/output modules (load locks) to the process modules and back again. A traditional process tool layout uses a single wafer transfer robot at the center of the tool and multiple process module spaces (such as 4-6) in a polar array around the robot as shown with the cluster tool example of FIG. 1. Cluster Tools typically have a round footprint and are not optimally shaped to be placed in rows because of their width. Factory planners are pushing to reduce the width of an individual process tool to fit more equipment in each factory bay to increase production without having to add floor space. One method to reduce individual tool width is to abandon the polar array arrangement of process modules in favor of a linear array. A linear process module array requires more complex automation which includes the ability to move the robot on a linear axis from the front to back of the tool. This type of robot is referred to as a "Linear Robot". The width of the overall tool is limited by the depth of the process module and the width of the Linear Robot. As described herein, a method is disclosed to reduce the width and complexity of a Linear Robot with use of a two-link arm to fold flat in the retracted position (inside the linear tunnel) as further described below.

Figure 2:
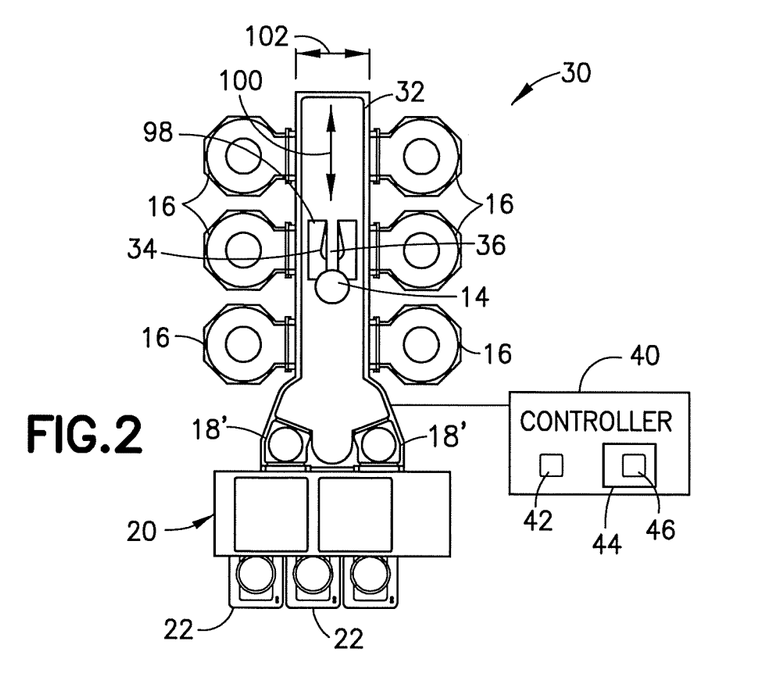
FIG. 2 is a top plan view of an example of an embodiment comprising features as described herein.

Referring also to FIG. 2, there is shown a schematic top view of a substrate processing apparatus 30 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 3A:
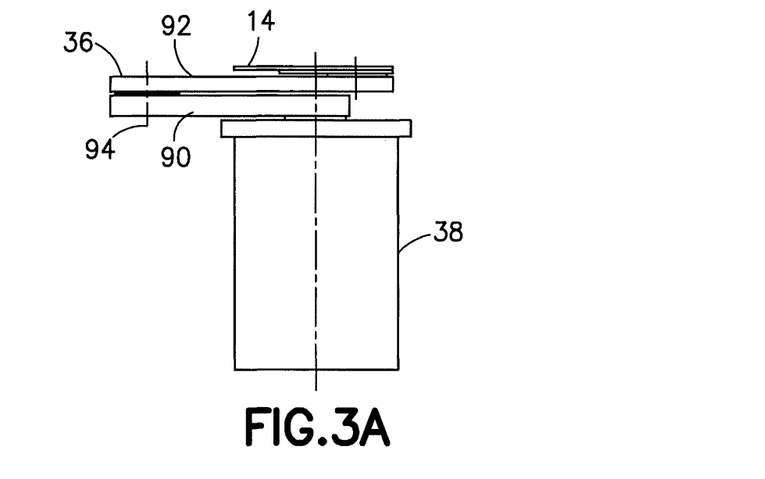
FIG. 3A is a side view of the robot shown in FIG. 2.
Figure 3B:
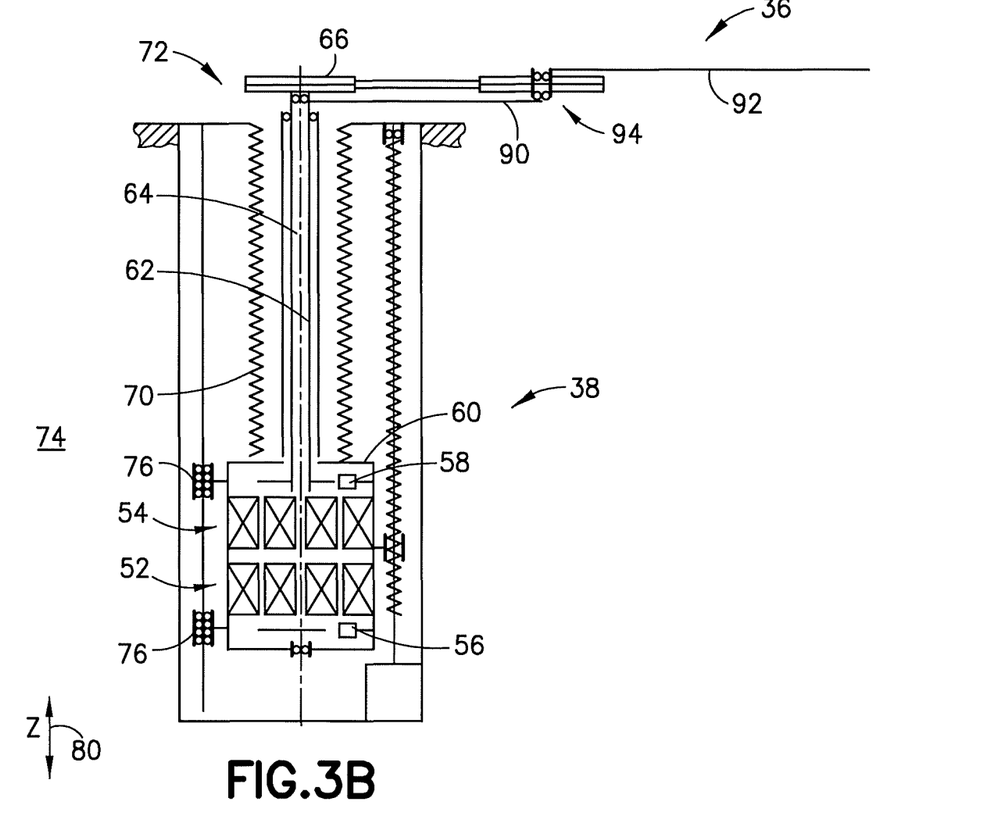
FIG. 3B is a schematic sectional view of the robot shown in FIG. 3A.

The substrate processing apparatus 30 generally comprises a substrate transport chamber 32, the substrate processing modules 16, load locks 18', the Equipment Front End Module (EFEM) 20 having substrate cassette elevators 22, and a linear robot 34 comprising a two-link arm 36 and a robot drive 38 (see FIGS. 3A-3B). The apparatus 30 is connected to a controller 40 which comprises at least one processor 42 and at least one memory 44 including computer program code 46. FIG. 2 is an example of the linear robot having the two-link arm in a compact retract position.

Referring also to FIGS. 3A-3B, the two-link arm 36 generally comprises a first link or upper arm 90 and a second link forming the end effector 92 rotatably connected to the upper arm 90 a joint 94. The robot drive 38 comprises first and second motors 52, 54 with corresponding first and second encoders 56, 58 coupled to housing 60 and respectively driving first and second shafts 62, 64. Here shaft 62 may be coupled to pulley 66 and shaft 64 may be coupled to upper arm 90 where shafts 62, 64 may be concentric or otherwise disposed. In alternate aspects, any suitable drive may be provided. Housing 60 may be in communication with chamber 68 where bellows 70, chamber 68 and an internal portion of housing isolate a vacuum environment 72 from an atmospheric environment 74. Housing 60 may slide in a z direction as a carriage on slides 76 where a lead screw or other suitable vertical or linear z drive 78 may be provided to selectively move housing 60 and two-link arm 36 coupled there to in a z 80 direction. The robot 34 is mounted on a linear transport apparatus 98 which is configured to move the robot 36 along a linear path inside the chamber 32 as indicated by arrow 100 in FIG. 2. This may be with use of rails or maglev for example. Features as described herein may include features as described in U.S. Pat. Nos. 10,269,606, 9,149,936, 10,224,232 and U.S. patent publication Nos. US 2019/0115238 A1, US 2018/0104831 A1 which are hereby incorporated by reference in their entireties.

The two-link arm 36 has an advantage over a traditional SCARA arm in a linear system because arm is slim when positioned in the folded or link over link position. As seen in FIG. 2 versus FIG. 1, this results in an ability to use a narrow width 102 of the linear chamber or tunnel 32 and overall system while still being able to reach the extended positions at the process modules 16 and load locks 18'. A two-link or dual-link arm merely has two links connected in series from the robot drive with one of those links forming the end effector for supporting the substrate.

Figure 4:
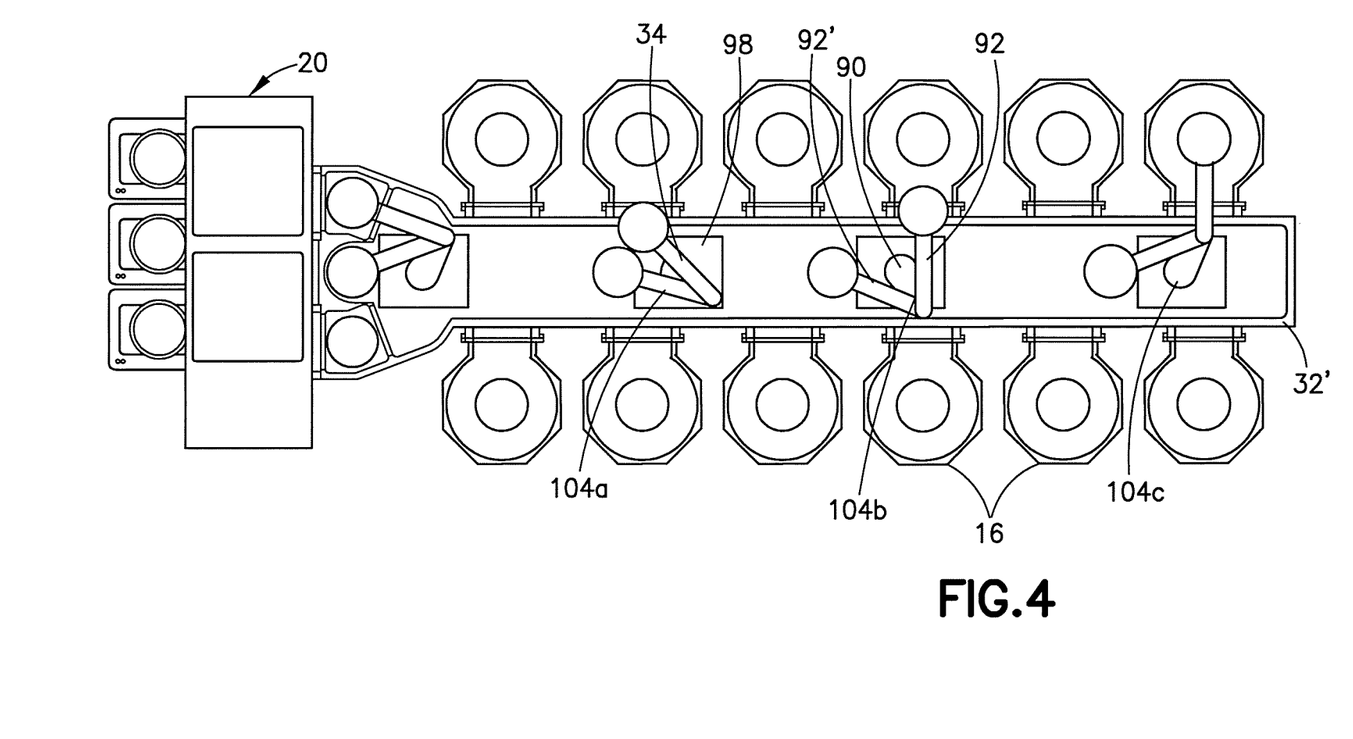
FIG. 4 is a top plan view of an example embodiment comprising features as described herein.
Figure 5A:
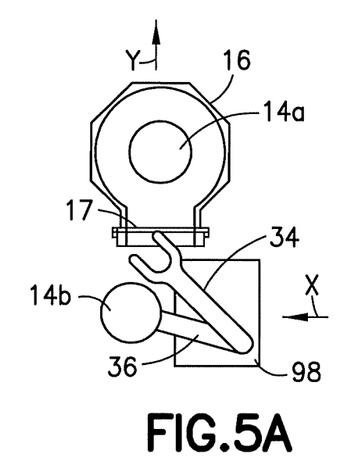
FIGS. 5A-5E are schematic top plan views illustrating removing a substrate from a process module by moving the robot and linear transport at a same time.
Figure 5B:
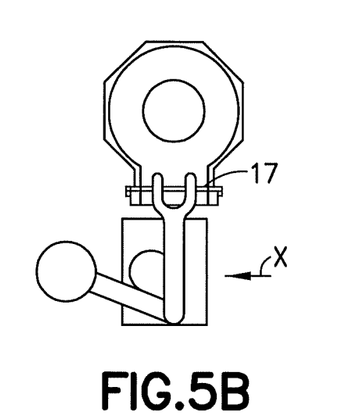
Figure 5C:
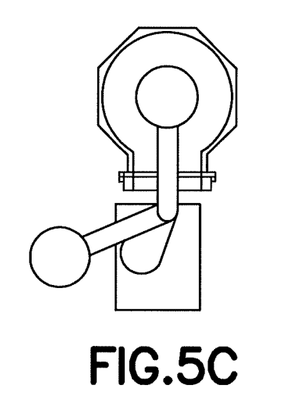
Figure 5D:
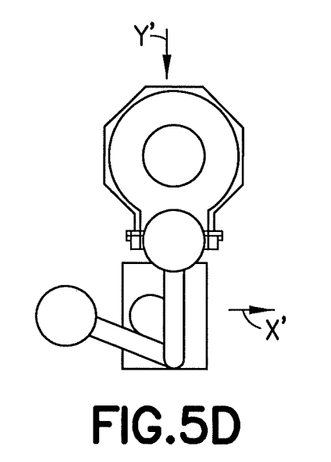
Figure 5E:
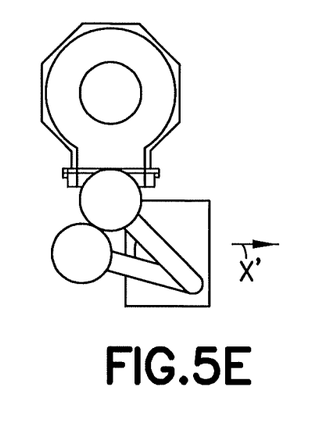
Figure 5F:
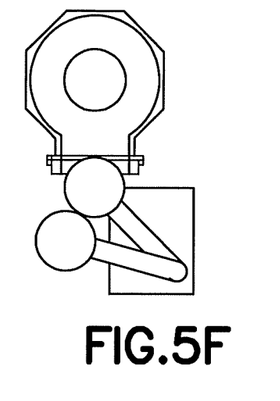
FIGS. 5F-5J are schematic top plan views illustrating placing a substrate into a process module by moving the robot and linear transport at a same time.
Figure 5G:
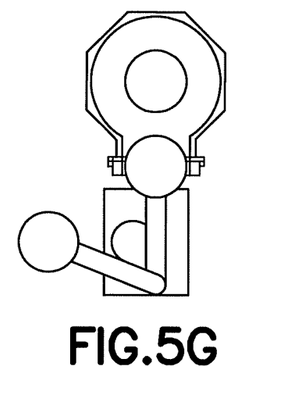
Figure 5H:
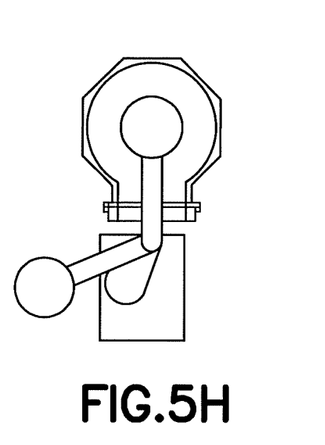
Figure 5I:
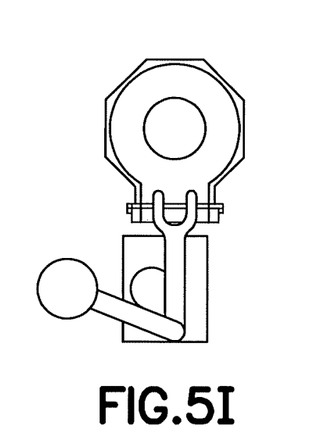
Figure 5J:
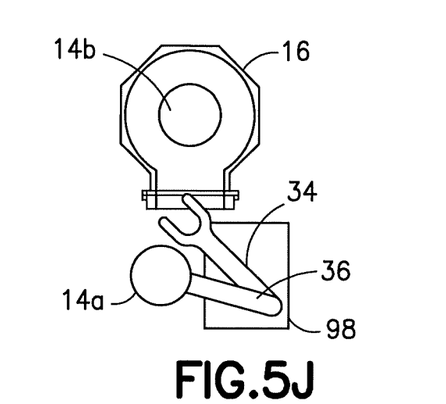

Referring also to FIG. 4, this example embodiment illustrates that much more than six process modules 16 may be attached to the transport chamber 32'. This also illustrates how the transport apparatus 98 and the robot 34 can be used to access the various process modules 16 with the two-link arm 36 as illustrated by configurations 104a, 104b, 104c. FIG. 4 illustrates an example motion of linear robot with dual independent end effector two link arm. The arm in this example comprises a first link 90 attached directly to a drive shaft of the robot drive and two second links 92, 92' connected to the first link 90. Thus, a first dual-link arm is provided with links 90, 92 and a second dual-link arm is provided with links 90, 92'.

Each of the two-link arms can support one or more independent end effectors. Use of a single end effector system reduces cost, complexity, and size of the system by reducing the number of motion axis needed to control the robot. Use of a robot with multiple end effectors can perform fast swaps at load lock and process modules. A fast swap comprises a sequential pick and place transfer at a same station (pick a substrate from a station with one end effector and place a second substrate to the same station with a second end effector). A robot with multiple end effectors can fast swap at the load lock and then fast swap at a process module. This is illustrated in the sequence of snapshot type illustrations of FIGS. 5A-5J. FIG. 5A-5E show withdrawing the substrate 14a from the process module, and FIGS. 5F-5J show insertion of a new substrate 14b into the same module 16.

With reference to FIGS. 5A-5E, as the linear transport is moved in direct X, the robot drive moves the dual-link arm 36 to move the end effector into the entrance 17 of the process module 16. Because of the size, shape and locations of the various components, and the reduced width 102 of the transport chamber, the only way for the end effector to enter the entrance 17 is for the rotation of the robot arm 36 and the linear movement of the linear transport to be coordinated together to allow the end effector to start to pass into the entrance in angled direction Y; in this case orthogonal to direction X. The longitudinal length of the second link may be longer than the width 102 of the transport chamber 32 for example. The second link 92 may enter the entrance 17 at an angle and then be moved straight into the module 16 after initially passing through the entrance at an angle or along a curved path. Thus, the movement of the end effector into the module may be non-translational, but then it might subsequently change into translational movement for a finishing stroke of the movement. Once the substrate 14a is lifted by the end effector, the robot motor and linear transport may be coordinatingly moved with directs X' and Y' to remove the end effector and substrate from the module.

In one example the two-link arm can use the robot's linear axis (motion in direction 100) to control end effector orientation during arm extend and retract motions. In another example, the two-link arm cannot use the robot's linear axis to control end effector orientation during arm extend and retract motions.

The robot's linear axis can be moved in either direction, as shown by arrow 100, to control end effector orientation at different arm extensions. This control can be applied to maintain alignment between the end effector and station while the arm extends and retracts. This may be desirable for certain types of stations such as process modules.

The robot's linear axis can also remain stationary during arm extend and retract movements which may allow arm to extend and or retract to stations where the linear axis cannot move, such as at the end of linear axis travel in either direction.

A third option is to combine segments of motion that use and do not use the robot's linear axis to perform non-traditional extend or retract motions if necessary.

Figure 6:
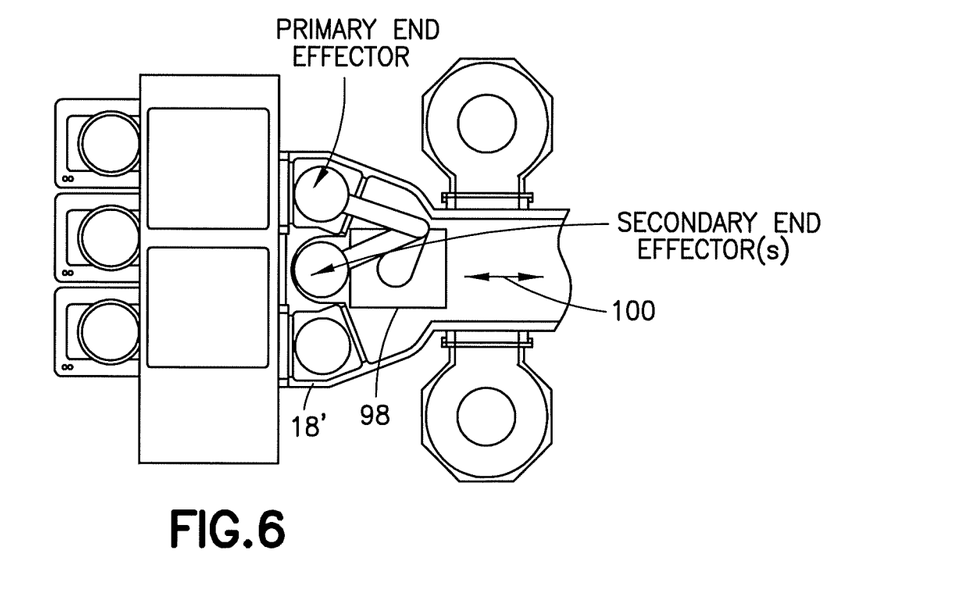
FIG. 6 is a schematic top plan view showing one example embodiment of a load lock area.
Figure 7:
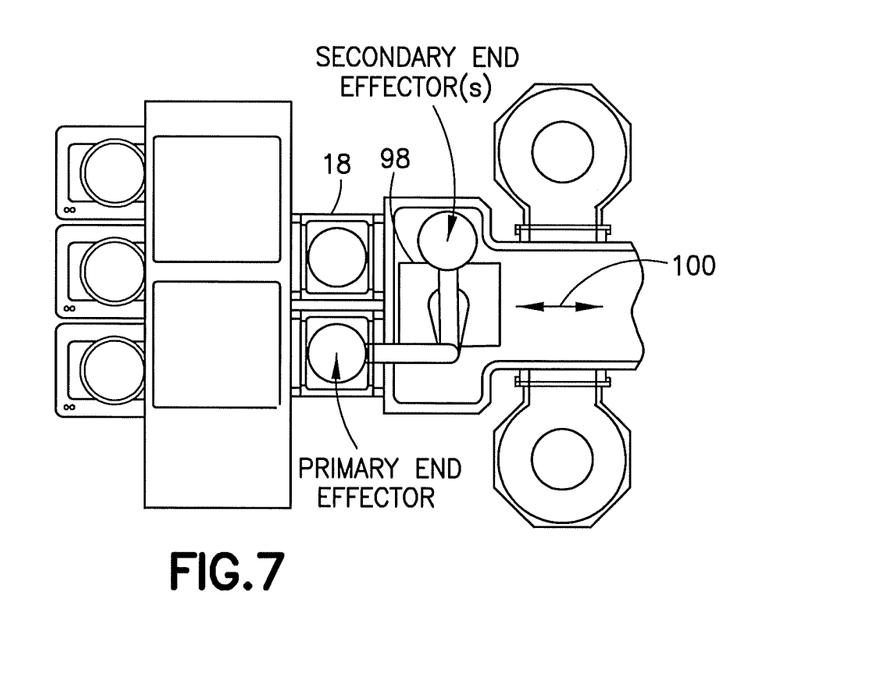
FIG. 7 is a schematic top plan view showing one example embodiment of a load lock area.
Figure 8:
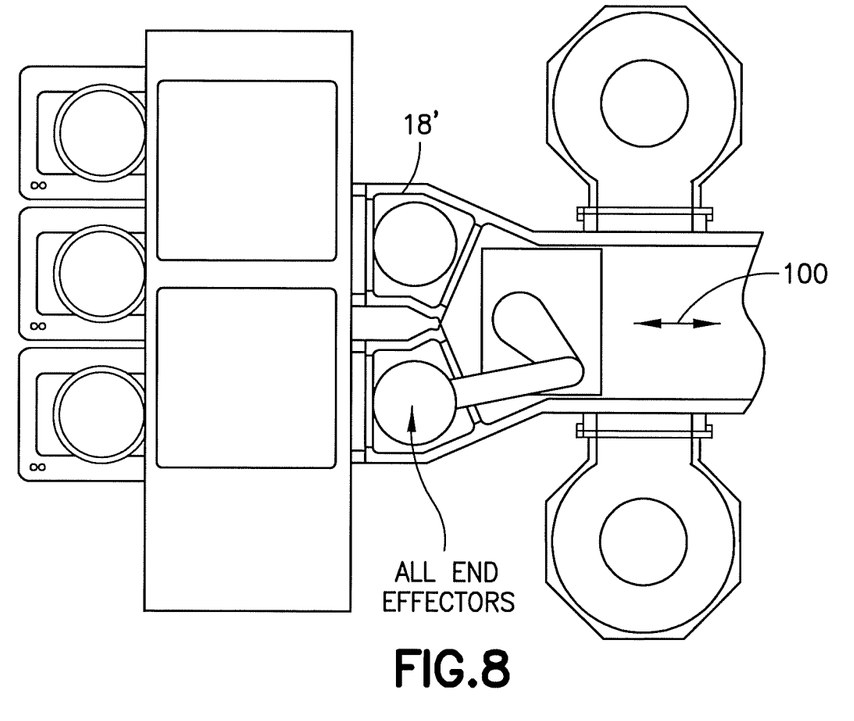
FIG. 8 is a schematic top plan view showing one example embodiment of a load lock area.
Figure 9A:
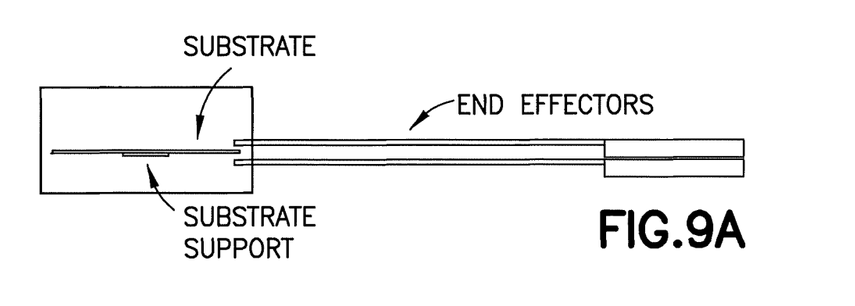
FIGS. 9A-9E illustrate a side view of an end effector movement for a pick of a substrate.
Figure 9B:
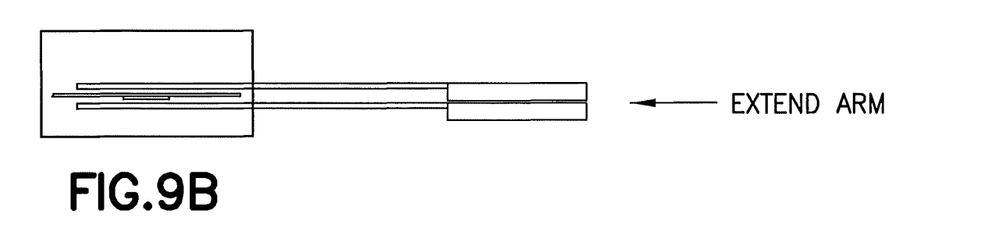
Figure 9C:
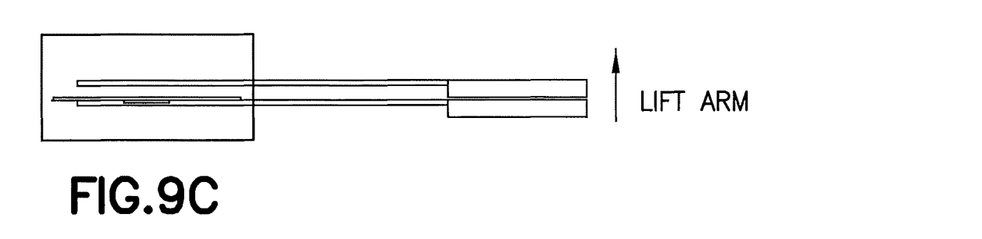
Figure 9D:
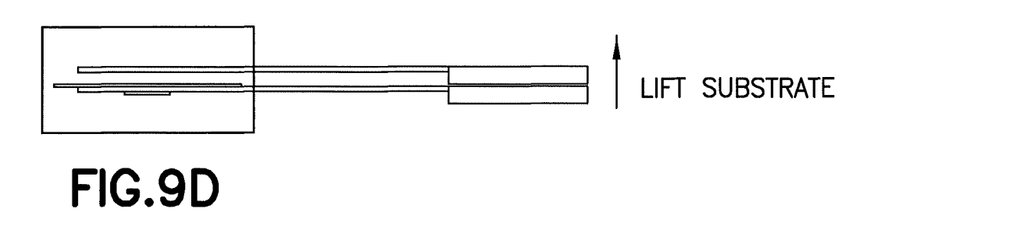
Figure 9E:
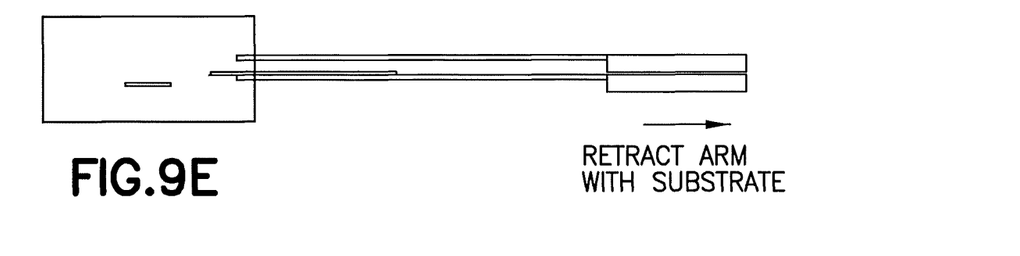
Figure 10A:
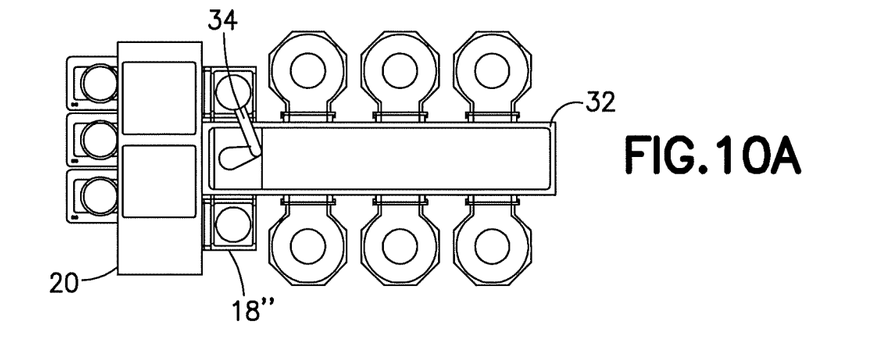
FIGS. 10A-10E shown examples of embodiments having features as described herein.
Figure 10B:
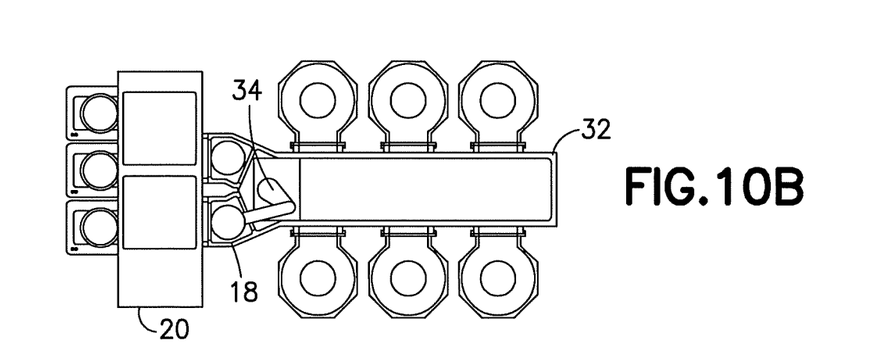
Figure 10C:
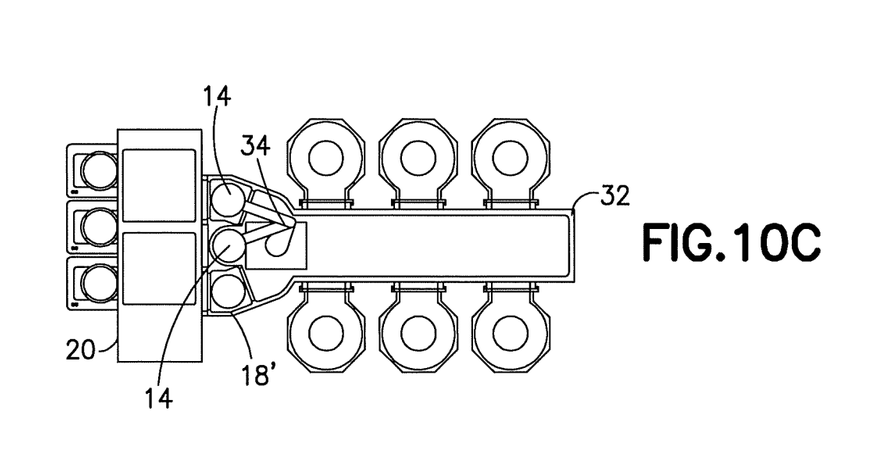
Figure 10D:
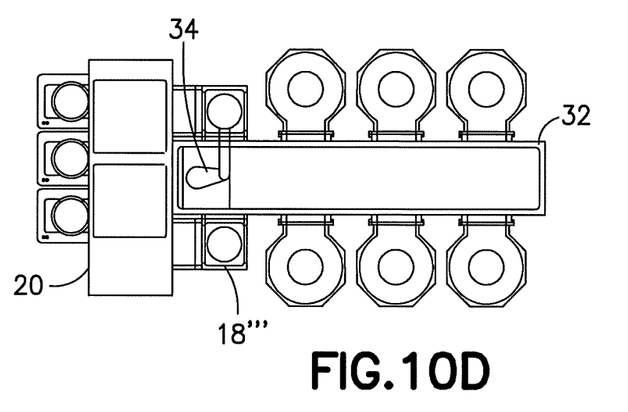
Figure 10E:
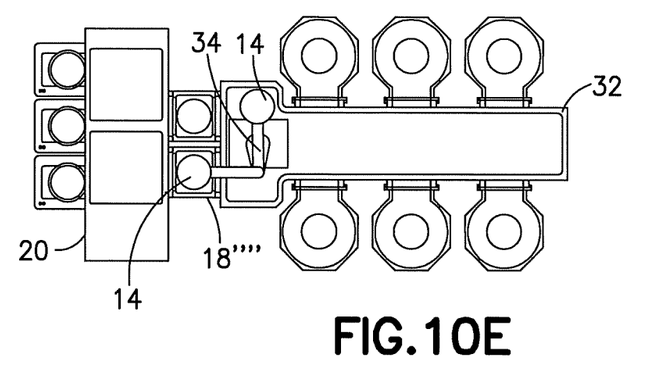

A narrow transport chamber limits the space available at the end of the chamber to integrate and access the load lock modules. The position of the load locks determines the use of two primary types of robot motion while accessing the load lock stations:

a. Robot motion where the primary end effector enters the load lock and the secondary end effector(s) rotate to an alternate open space in the chamber during load lock transfers as illustrated in FIGS. 6-7.
b. Robot motion where all end effector(s) enter the load lock during transfers as illustrated in FIG. 8. This type of transfer would require substrate supports in the load lock at the same vertical spacing as the pitch between end effectors. The number of slots for substrates would dictate the number of wafers transferred. If the robot has two end effectors the number of load lock slots would be one as illustrated by FIGS. 9A-9E which shows an example of two end effector transfer to station with all end effectors inside station. Substrates can be placed into one load lock and then picked from another load lock or multiple groups of substrate supports can be stacked in a single load lock for pick and place transfers to the same load lock. In an alternate example, there may be any suitable number of end effectors.
c. Examples of load lock configurations 18, 18', 18", 18''', 18'''' between the transport chamber 32 and the EFEM 20 are shown in FIGS. 10A-10E which may be used with the robot 34. Please note that these are merely examples and should not be considered as limiting.

In accordance with one example embodiment, an apparatus is provided comprising a linear transport configured to move in a transport chamber along a straight path; a robot connected to the linear transport, where the robot comprises a robot drive and a robot arm connected to the robot drive, where the robot arm comprises a dual-link arm having a first link connected to the robot drive and a second link forming an end effector for supporting a substrate thereon; a controller connected to the linear transport and to the robot drive, where the controller is configured to control movement of the linear transport along the straight path, where the controller is configured to control the robot drive to extend and retract the dual-link arm, where the controller is configured to provide the movement of the linear transport along the straight path at a same time as extension and retraction of the dual-link arm to thereby move the end effector into or out of a substrate process chamber or a substrate holding area while both the linear transport and the dual-link arm are moving.

The apparatus may further comprise the transport chamber, and a plurality of the substrate process chamber connected to the transport chamber on opposite sides of the transport chamber, where the apparatus is sized and shaped such that the end effector is incapable of being moved into or out of the substrate process chambers by the dual-link arm unless the linear transport is being moved. The apparatus may further comprise a second linear transport configured to move in the transport chamber at least partially along the straight path; and a second robot connected to the second linear transport, where the second robot comprises a second robot drive and a second robot arm connected to the second robot drive, where the second robot arm comprises a second dual-link arm having a third link connected to the second robot drive and a fourth link forming a second end effector for supporting a substrate thereon, where the controller is connected to the second linear transport and to the second robot drive, where the controller is configured to control movement of the second linear transport along the straight path, where the controller is configured to control the second robot drive to extend and retract the second dual-link arm, where the controller is configured to provide the movement of the second linear transport along the straight path at a same time as extension and retraction of the second dual-link arm to thereby move the second end effector into or out of a substrate process chamber or a substrate holding area while both the second linear transport and the second dual-link arm are moving. The transport chamber may comprise a first section having a general rectangular shape and a second section at an end of the general rectangular shape, where the second section is wider than the first section and is connected to or forms at least two of the substrate holding area. The apparatus may further comprise an equipment front end module connected to the second section of the transport chamber, where the equipment front end module comprises substrate cassette elevators and is configured to move substrates between the substrate cassette elevators and the at least two substrate holding areas. The robot arm may comprise a third link connected to the first link, where the first link and the third link form a second dual-link arm having a second end effector formed on the third link. The apparatus may further comprise the transport chamber, and a plurality of the substrate holding area at an end of the transport chamber, where each of the substrate holding areas have a center axis at least partially offset from, or are angled relative to, a center axis along the straight path of the transport chamber.

An example method may comprise providing a robot comprising a robot drive and a robot arm connected to the robot drive, where the robot arm comprises a dual-link arm having a first link connected to the robot drive and a second link forming an end effector for supporting a substrate thereon; mounting the robot onto a linear transport, where the linear transport is configured to move in a transport chamber along a straight path; connecting the robot drive and the linear transport to a controller, where the controller is configured to control movement of the linear transport along the straight path, and where the controller is configured to control the robot drive to extend and retract the dual-link arm, where the controller is configured to provide the movement of the linear transport along the straight path at a same time as the robot drive extension and retraction of the dual-link arm to thereby move the end effector into or out of a substrate process chamber or a substrate holding area while both the linear transport and the dual-link arm are moving.

The transport chamber, the robot arm and the linear transport may be sized and shaped such that the end effector is incapable of being moved into or out of the substrate process chamber by the dual-link arm unless the linear transport is being moved. The method may further comprise providing a second robot comprising a second robot drive and a second robot arm connected to the second robot drive, where the second robot arm comprises a second dual-link arm having a third link connected to the second robot drive and a fourth link forming a second end effector for supporting a substrate thereon; mounting the second robot onto a second linear transport, where the second linear transport is configured to move in the transport chamber at least partially along the straight path; connecting the second robot drive and the second linear transport to the controller, where the controller is configured to control movement of the second linear transport along the straight path, and where the controller is configured to control the second robot drive to extend and retract the second dual-link arm, where the controller is configured to provide the movement of the second linear transport along the straight path at a same time as the second robot drive extension and retraction of the second dual-link arm to thereby move the second end effector into or out of a substrate process chamber or a substrate holding area while both the second linear transport and the second dual-link arm are moving. The transport chamber may comprise a first section having a general rectangular shape and a second section at an end of the general rectangular shape, where the second section is wider than the first section and is connected to or forms at least two of the substrate holding area. The robot arm may comprise a third link connected to the first link, where the first link and the third link form a second dual-link arm having a second end effector formed on the third link. A plurality of the substrate holding area may be provided at an end of the transport chamber, where each of the substrate holding areas have a center axis at least partially offset from, or are angled relative to, a center axis along the straight path of the transport chamber.

An example method may be provided comprising moving a linear transport along a straight path inside a transport chamber; extending or retracting a robot arm at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon; controlling, by a controller connected to the linear transport and to the robot drive, the moving of the linear transport along the straight path and extension and retraction of the dual-link arm to thereby move the end effector into or out of a substrate process chamber or a substrate holding area while both the linear transport and the dual-link arm are moving.

The transport chamber, the robot arm and the linear transport may be sized and shaped such that the end effector is incapable of being moved into or out of the substrate process chamber by the dual-link arm unless the linear transport is being moved. The method may further comprise moving a second linear transport at least partially along the straight path inside the transport chamber; extending or retracting a second robot arm at a same time the second linear transport is moving along the straight path, where the second robot arm is part of a second robot having a second robot drive connected to the second robot arm, where the second robot arm comprises a second dual-link arm having a third link connected to the second robot drive and a fourth link forming a second end effector for supporting a substrate thereon; controlling, by the controller connected to the second linear transport and to the second robot drive, the moving of the second linear transport along the straight path and extension and retraction of the second dual-link arm to thereby move the second end effector into or out of a substrate process chamber or a substrate holding area while both the second linear transport and the second dual-link arm are moving. The robot arm may comprise a third link connected to the first link, where the first link and the third link form a second dual-link arm having a second end effector formed on the third link, and the method comprises controlling, by the controller connected to the linear transport and to the robot drive, the moving of the linear transport along the straight path and extension and retraction of the second dual-link arm to thereby move the second end effector into or out of a substrate process chamber or a substrate holding area while both the linear transport and the second dual-link arm are moving.

An example embodiment may be provided in an apparatus comprising means for moving a linear transport along a straight path inside a transport chamber; means for extending or retracting a robot arm at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon; means for controlling, by a controller connected to the linear transport and to the robot drive, the moving of the linear transport along the straight path and extension and retraction of the dual-link arm to thereby move the end effector into or out of a substrate process chamber or a substrate holding area while both the linear transport and the dual-link arm are moving.

An example embodiment may be provided with an apparatus comprising at least one processor; and at least one non-transitory memory including computer program code, the at least one memory and the computer program code configured to, with the at least one processor, cause the apparatus to:

move a linear transport along a straight path inside a transport chamber;

extend or retract a robot arm at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon;

control the moving of the linear transport along the straight path and extension and retraction of the dual-link arm to thereby move the end effector into or out of a substrate process chamber or a substrate holding area while both the linear transport and the dual-link arm are moving.

An example embodiment may be provided with a non-transitory program storage device readable by a machine, tangibly embodying a program of instructions executable by the machine for performing operations, the operations comprising:

causing a linear transport to move along a straight path inside a transport chamber;

causing a robot arm to extend or retract at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon;

cause the moving of the linear transport along the straight path and extension and retraction of the dual-link arm to move the end effector into or out of a substrate process chamber or a substrate holding area while both the linear transport and the dual-link arm are moving.

To reduce cost and increase efficiency, modern semiconductor factories are constantly striving to fit more process equipment in a smaller building. A typical factory layout has process tools arranged in linear rows called bays. The number of bays that can fit on the floor of the factory is limited by individual process tool length (depth). The number of tools that can fit in each row is limited by individual process tool width. Each individual process tool consists of process modules and automation hardware to transfer wafers from input/output modules (load locks) to the process modules and back again. A traditional process tool layout uses a single wafer transfer robot at the center of the tool and multiple (4-6) process module spaces in a polar array around the robot. This type of layout is referenced as a "Cluster Tool" (see FIG. 1 for example). Cluster Tools typically have a round footprint and are not optimally shaped to be placed in rows because of their width. Factory planners are pushing to reduce the width of an individual process tool to fit more equipment in each factory bay to increase production without having to add floor space. Features as described herein may be used to reduce individual tool width by abandoning the polar array arrangement of process modules in favor of a linear array such as shown in FIG. 2 for example. A linear process module array requires more complex automation which includes the ability to move the robot on a linear axis from the front to back of the tool. This type of apparatus may be referred to as a "Linear Robot". The width of the overall tool is limited by the depth of the process module and the width of the Linear Robot. One method to reduce the width and complexity of a Linear Robot is to use a two-link arm to fold flat in the retracted position (inside the linear tunnel) as shown in FIG. 2.

A two-link arm has an advantage over a traditional SCARA arm in a linear system because the two-link arm is slim when positioned in the folded or link over link position as shown in FIG. 2. This results in a narrow width of the linear chamber or tunnel and overall system while still being able to reach the extended positions at the process modules and load locks (see FIGS. 5A-5J for example).

The two-link arm or dual-link arm may support one or more independent end effectors. A single end effector system reduces cost, complexity, and size of the system by reducing the number of motion axis needed to control the robot. A robot with multiple end effectors may perform fast swaps at load lock and process modules. A fast swap is defined as a sequential pick and place transfer at the same station (pick a substrate from a station with one end effector and place a second substrate with a second end effector to the same station). A robot with two end effectors can fast swap at the load lock and then fast swap at a process module. A robot with more than two end effectors (n) could pick multiple substrates at the load lock and then perform fast swaps at n−1 number of process modules. For example, a robot with three end effectors could pick two substrates at the load lock and then perform fast swaps at two different process modules. A robot with 4 end effectors could pick 3 substrates at the load locks and perform fast swaps at 3 different process modules.

The two-link arm may use the robot's linear axis to control end effector orientation during arm extend and retract motions and, alternatively in some circumstances, may not use the robot's linear axis to control end effector orientation during arm extend and retract motions. The robot's linear axis can be moved in either direction to control end effector orientation at different arm extensions. This control can be applied to maintain alignment between the end effector and station while the arm extends and retracts. This may be desirable for certain types of stations such as process modules. The robot's linear axis can also remain stationary during arm extend and retract movements which may allow arm to extend and or retract to stations where the linear axis cannot move such, as at the end of linear axis travel in either direction for example. A third option is to combine segments of motion that use and do not use the robot's linear axis to perform non-traditional extend or retract motions if necessary.

A narrow transport chamber limits the space available at the end of the chamber to integrate and access the load lock modules. The position of the load locks determines the use of two primary types of robot motion while accessing the load lock stations:

Robot motion where the primary end effector enters the load lock and the secondary end effector(s) rotate to an alternate open space in the chamber during load lock transfers (see FIGS. 6-7 for example).

Robot motion where all end effector(s) enter the load lock during transfers (see FIG. 8 for example). This type of transfer would require substrate supports in the load lock at the same vertical spacing as the pitch between end effectors. The number of slots for substrates would dictate the number of wafers transferred. If the robot has two end effectors the number of load lock slots would be one (see FIGS. 9A-9E). If the robot has three end effectors the number of load lock slots would be two. Substrates can be placed into one load lock and then picked from another load lock or multiple groups of substrate supports can be stacked in a single load lock for pick and place transfers to the same load lock.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
 a linear transport configured to move in a transport chamber along a straight path;
 a robot connected to the linear transport, where the robot comprises a robot drive and a robot arm connected to the robot drive, where the robot arm comprises a dual-link arm having a first link connected to the robot drive and a second link forming an end effector for supporting a substrate thereon;
 a controller connected to the linear transport and to the robot drive, where the controller is configured to control movement of the linear transport along the straight path, where the controller is configured to control the robot drive to extend and retract the dual-link arm, where the controller is configured to provide the movement of the linear transport along the straight path at a same time as extension and retraction by rotation of the dual-link arm to coordinate a non-translational movement of the end effector along a curved path relative to an entrance of a substrate process chamber and through the entrance with a translational movement of the end effector from the entrance and to an inside of the substrate process chamber to thereby move the end effector into or out of the substrate process chamber or a substrate holding area while both the linear transport and the dual-link arm are moving.

2. The apparatus as in claim 1 further comprising the transport chamber, and a plurality of the substrate process chamber connected to the transport chamber on opposite sides of the transport chamber, where the apparatus is sized and shaped such that the end effector is incapable of being moved into or out of the substrate process chambers by the dual-link arm unless the linear transport is being moved.

3. The apparatus as in claim 2 further comprising:
a second linear transport configured to move in the transport chamber at least partially along the straight path; and a second robot connected to the second linear transport, where the second robot comprises a second robot drive and a second robot arm connected to the second robot drive, where the second robot arm comprises a second dual-link arm having a third link connected to the second robot drive and a fourth link forming a second end effector for supporting a substrate thereon,
where the controller is connected to the second linear transport and to the second robot drive, where the controller is configured to control movement of the second linear transport along the straight path, where the controller is configured to control the second robot drive to extend and retract the second dual-link arm,
where the controller is configured to provide the movement of the second linear transport along the straight path at a same time as extension and retraction of the second dual-link arm to thereby move the second end effector into or out of a substrate process chamber or a substrate holding area while both the second linear transport and the second dual-link arm are moving.

4. The apparatus as in claim 2 where the transport chamber comprises a first section having a general rectangular shape and a second section at an end of the general rectangular shape, where the second section is wider than the first section and is connected to or forms at least two of the substrate holding area.

5. The apparatus as in claim 4 further comprising equipment front end module connected to the the second section of the transport chamber, where equipment front end module comprises substrate cassette elevators and is configured to move substrates between the substrate cassette elevators and the at least two substrate holding areas.

6. The apparatus as in claim 1 where the robot arm comprises a third link connected to the first link, where the first link and the third link form a second dual-link arm having a second end effector formed on the third link.

7. The apparatus as in claim 1 further comprising the transport chamber, and a plurality of the substrate holding area at an end of the transport chamber, where each of the substrate holding areas have a center axis at least partially offset from, or are angled relative to, a center axis along the straight path of the transport chamber.

8. A method comprising:
providing a robot comprising a robot drive and a robot arm connected to the robot drive, where the robot arm comprises a dual-link arm having a first link connected to the robot drive and a second link forming an end effector for supporting a substrate thereon;
mounting the robot onto a linear transport, where the linear transport is configured to move in a transport chamber along a straight path;
connecting the robot drive and the linear transport to a controller, where the controller is configured to control movement of the linear transport along the straight path, and where the controller is configured to control the robot drive to extend and retract the dual-link arm,
where the controller is configured to provide the movement of the linear transport along the straight path at a same time as the robot drive extension and retraction by rotation of the dual-link arm to coordinate a non-translational movement of the end effector along a curved path relative to an entrance of a substrate process chamber through the entrance with a translational movement of the end effector from the entrance and to an inside of the substrate process chamber to thereby move the end effector into or out of the substrate process chamber or a substrate holding area while both the linear transport and the dual-link arm are moving.

9. The method as in claim 8 where the transport chamber, the robot arm and the linear transport are sized and shaped such that the end effector is incapable of being moved into or out of the substrate process chamber by the dual-link arm unless the linear transport is being moved.

10. The method as in claim 8 further comprising
providing a second robot comprising a second robot drive and a second robot arm connected to the second robot drive, where the second robot arm comprises a second dual-link arm having a third link connected to the second robot drive and a fourth link forming a second end effector for supporting a substrate thereon;
mounting second robot onto a second linear transport, where the second linear transport is configured to move in the transport chamber at least partially along the straight path;
connecting the second robot drive and the second linear transport to the controller, where the controller is configured to control movement of the second linear transport along the straight path, and where the controller is configured to control the second robot drive to extend and retract the second dual-link arm,
where the controller is configured to provide the movement of the second linear transport along the straight path at a same time as the second robot drive extension and retraction of the second dual-link arm to thereby move the second end effector into or out of a substrate process chamber or a substrate holding area while both the second linear transport and the second dual-link arm are moving.

11. The method as in claim 8 where the transport chamber comprises a first section having a general rectangular shape and a second section at an end of the general rectangular shape, where the second section is wider than the first section and is connected to or forms at least two of the substrate holding area.

12. The method as in claim 8 where the robot arm comprises a third link connected to the first link, where the first link and the third link form a second dual-link arm having a second end effector formed on the third link.

13. The method as in claim 8 where a plurality of the substrate holding area are provided at an end of the transport chamber, where each of the substrate holding areas have a center axis at least partially offset from, or are angled relative to, a center axis along the straight path of the transport chamber.

14. A method comprising:
  moving a linear transport along a straight path inside a transport chamber;
  extending or retracting a robot arm at a same time the linear transport is moving along the straight path, where the robot arm is part of a robot having a robot drive connected to the robot arm, where the robot arm comprises a dual-link arm having a first link connected to the robot drive and a second link forming an end effector for supporting a substrate thereon;
  controlling, by a controller connected to the linear transport and to the robot drive, the moving of the linear transport along the straight path at a same time as extension and retraction by rotation of the dual-link arm to coordinate a non-translational movement of the end effector along a curved path relative to an entrance of a substrate process chamber through the entrance with a translational movement of the end effector from the entrance and to an inside of the substrate process chamber to thereby move the end effector into or out of the substrate process chamber or a substrate holding area while both the linear transport and the dual-link arm are moving.

15. The method as in claim 14 where the transport chamber, the robot arm and the linear transport are sized and shaped such that the end effector is incapable of being moved into or out of the substrate process chamber by the dual-link arm unless the linear transport is being moved.

16. The method as in claim 14 further comprising:
  moving a second linear transport at least partially along the straight path inside the transport chamber;
  extending or retracting a second robot arm at a same time the second linear transport is moving along the straight path, where the second robot arm is part of a second robot having a second robot drive connected to the second robot arm, where the second robot arm comprises a second dual-link arm having a third link connected to the second robot drive and a fourth link forming a second end effector for supporting a substrate thereon;
  controlling, by the controller connected to the second linear transport and to the second robot drive, the moving of the second linear transport along the straight path and extension and retraction of the second dual-link arm to thereby move the second end effector into or out of a substrate process chamber or a substrate holding area while both the second linear transport and the second dual-link arm are moving.

17. The method as in claim 14 where the robot arm comprises a third link connected to the first link, where the first link and the third link form a second dual-link arm having a second end effector formed on the third link, and the method comprises controlling, by the controller connected to the linear transport and to the robot drive, the moving of the linear transport along the straight path and extension and retraction of the second dual-link arm to thereby move the second end effector into or out of a substrate process chamber or a substrate holding area while both the linear transport and the second dual-link arm are moving.

* * * * *